United States Patent [19]
Nagai

[11] Patent Number: 5,770,471
[45] Date of Patent: Jun. 23, 1998

[54] METHOD OF MAKING SEMICONDUCTOR LASER WITH ALUMINUM-FREE ETCH STOPPING LAYER

[75] Inventor: Yutaka Nagai, Itami, Japan

[73] Assignee: Mitsubishi Denki Kabushiki Kaisha, Tokyo, Japan

[21] Appl. No.: 508,211

[22] Filed: Jul. 27, 1995

[30] Foreign Application Priority Data

Jul. 28, 1994 [JP] Japan .................................. 6-176702

[51] Int. Cl.$^6$ .................................................. H01L 21/00
[52] U.S. Cl. ................................. 438/31; 438/40; 438/47
[58] Field of Search ................................. 438/39, 31, 40, 438/41, 45, 46, 47

[56] References Cited

U.S. PATENT DOCUMENTS 4,961,197 10/1990 Tanaka et al. .............................. 372/45
5,373,520 12/1994 Shoji et al. ................................. 372/4

OTHER PUBLICATIONS

Shima et al, "High–Power Multi–Beam AlGaAs TOW Lasers With Bruied–Ridge, Stripe Structure Fabricated By Using Novel Etching Stop Technique", 13th IEEE International Semiconductor Laser Conference, Sep. 1994, pp. 98–99.

*Primary Examiner*—Brian Dutton
*Attorney, Agent, or Firm*—Leydig, Voit & Mayer, Ltd.

[57] ABSTRACT

In fabricating a semiconductor laser, an etch stopping layer of a semiconductor material not containing Al has a dopant impurity introduced during growth, by ion-implantation or by diffusion, from a high dopant concentration region located near the etch stopping layer. Since the etch stopping layer does not contain Al, it is less likely that the etch stopping layer will be oxidized during fabrication and a current blocking layer grown on the etch stopping layer has improved crystalline quality. Therefore, the current blocking effect is maintained and the reliability of the device is improved. The dopant impurity causes disordering of the etch stopping layer upon heat treatment, resulting in a larger band gap energy for the etch stopping layer than for an active layer. This prevents laser light originating in the active layer from being absorbed by the etch stopping layer. The characteristics of the laser are improved.

25 Claims, 3 Drawing Sheets

Fig.4 (a) Prior Art
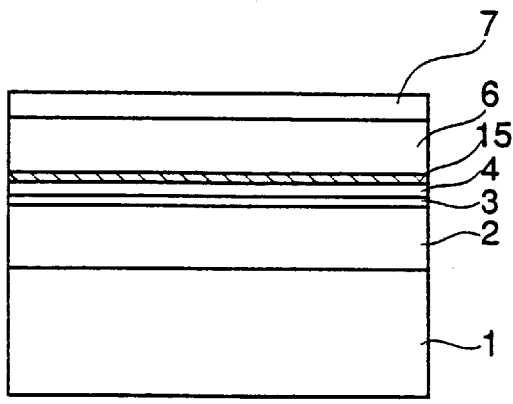
Fig.4 (c) Prior Art
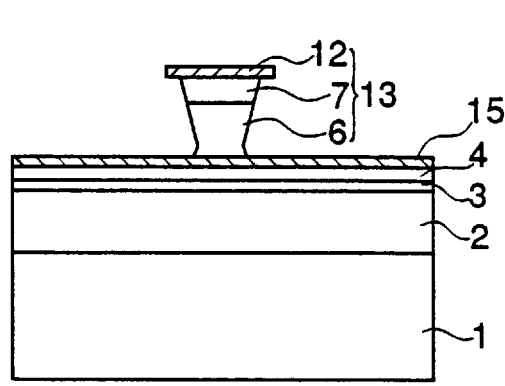
Fig.4 (b) Prior Art
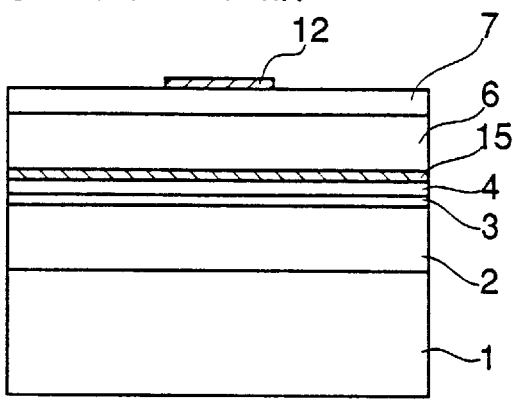
Fig.4 (d) Prior Art
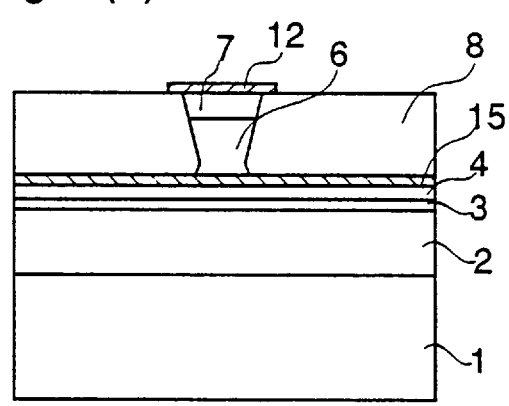
Fig.4 (e) Prior Art
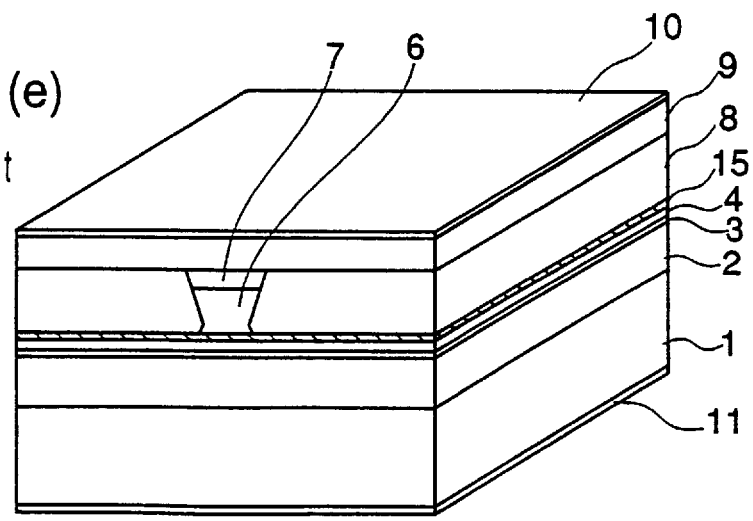

METHOD OF MAKING SEMICONDUCTOR LASER WITH ALUMINUM-FREE ETCH STOPPING LAYER

FIELD OF THE INVENTION

The present invention relates generally to a method of fabricating a semiconductor laser, and more particularly, to a method of fabricating a semiconductor laser used in information processing devices such as an optical disc apparatus. The present invention also relates to the semiconductor laser so fabricated.

BACKGROUND OF THE INVENTION

FIGS. 4(a)–4(d) are cross-sectional views and FIG. 4(e) is a perspective view showing how a semiconductor laser is fabricated in the prior art, where reference numeral 1 designates an n type GaAs semiconductor substrate having opposite front and rear surfaces, reference numeral 2 designates an n type $Al_{0.5}Ga_{0.5}As$ cladding layer, reference numeral 3 designates an active layer having a multi-quantum well structure comprising alternating $Al_{0.1}Ga_{0.9}As$ well layers and $Al_{0.3}Ga_{0.7}As$ barrier layers, reference numeral 4 designates a first p type $Al_{0.5}Ga_{0.5}As$ cladding layer, reference numeral 15 designates a p type $Al_{0.7}Ga_{0.3}As$ etching stopper layer, reference numeral 6 designates a second p type $Al_{0.5}Ga_{0.5}As$ cladding layer, reference numeral 7 designates a first p type GaAs contact layer, reference numeral 8 designates an n type $Al_{0.7}Ga_{0.3}As$ current blocking layer, reference numeral 9 designates a second p type GaAs contact layer, reference numeral 10 designates a p side electrode comprising Ti/Pt/Au, reference numeral 11 designates an n side electrode comprising AuGe/Ni/Ti/Au, and reference numeral 12 designates a ridge mask (insulating film pattern) made of an insulating film such as $Si_3N_4$ or $SiO_2$.

The method of fabricating a semiconductor laser in the prior art is explained as follows. First, the n type $Al_{0.5}Ga_{0.5}As$ cladding layer 2, the active layer 3, the first p type $Al_{0.5}Ga_{0.5}As$ cladding layer 4, the p type $Al_{0.7}Ga_{0.3}As$ etching stopper layer 15, the second p type $Al_{0.5}Ga_{0.5}As$ cladding layer 6, and the first p type GaAs contact layer 7 are epitaxially grown on the front surface of n type GaAs semiconductor substrate 1. A cross-section of the wafer after the crystal growth is shown in FIG. 4(a). Then the insulating film pattern (ridge mask) 12 having a stripe configuration is formed on the wafer as shown in FIG. 4(b), using materials such as $Si_3N_4$ or $SiO_2$. This insulating film pattern 12 serves as an etching mask for ridge formation. That is, as shown in FIG. 4(c), etching is done so that the ridge is obtained using the insulating film pattern 12 as a mask. In this etching process, by using such a selective etchant that the first p type GaAs contact layer 7 and the second p type $Al_{0.5}Ga_{0.5}As$ cladding layer are etched but the p type $Al_{0.7}Ga_{0.3}As$ etching stopper layer 15 is not, the ridge structure 13 is realized with good repeatability. An example of this etchant is a mixture of tartaric acid and hydrogen peroxide.

Next, as shown in FIG. 4(d), the n type GaAs current blocking layer 8 is grown at both sides of the ridge 13 so as to bury the ridge 13. The ridge mask 12 made of the insulating film also serves as a mask against the growth of the current blocking layer 8, so that there is no crystal growth on the ridge. After the insulating film 12 is removed by wet or dry etching, the second p type GaAs contact layer 9 is formed by crystal growth on the ridge and the current blocking layer 8. Finally, the n side electrode 11 and the p side electrode 10 are formed on the rear surface of n type GaAs semiconductor substrate 1 and on the second p type GaAs contact layer 9, respectively, to obtain the semiconductor laser shown in FIG. 4(e).

Next, an operating mechanism of the prior art semiconductor laser fabricated as described above is explained as follows. If a voltage is applied so that the p side electrode 10 becomes positive and the n side electrode 11 becomes negative, holes are injected through the second p type GaAs contact layer 9, the first p type GaAs contact layer 7, the second p type $Al_{0.5}Ga_{0.5}As$ cladding layer 6, and the first p type $Al_{0.5}Ga_{0.5}As$ cladding layer 4, and finally into the active layer 3, whereas electrons are injected through the n type GaAs semiconductor substrate 1 and the n type $Al_{0.5}Ga_{0.5}As$ cladding layer 2, and into the active layer 3. Electrons and holes, then, recombine and induced emission of light results within the active layer 3. If the injection rate of carriers is made to be sufficiently high so that the light is emitted more than compensates the loss along a waveguide path, laser oscillation occurs.

Next, the ridge structure is explained as follows. With the ridge structure, in the region excluded by the striped ridge region and filled with the n type $Al_{0.7}Ga_{0.3}As$ current blocking layer 8, the current blocking layer 8 makes p-n junctions both with the first p type $Al_{0.5}Ga_{0.5}As$ cladding layer 4 and the second p type GaAs contact layer 9. Therefore, even if a voltage is applied so that the p side electrode becomes positive, since a p-n-p junction is made in the region excluded by the ridge and it is reverse biased, no current flows. In other words, the n type $Al_{0.7}Ga_{0.3}As$ current blocking layer literally blocks the current. This forces the current to concentrate and flow only into the region of the active layer 3 directly below the ridge, and the current density sufficient for laser oscillation is obtained. Furthermore, since the refractive index of the n type $Al_{0.7}Ga_{0.3}As$ current blocking layer 8 is smaller than the refractive index of the second p type $Al_{0.5}Ga_{0.5}As$ cladding layer 6 constituting the ridge, the laser light is confined due to the difference of the indexes along a horizontal direction, so that the laser light is guided only to the ridge region. As a result, a horizontal transverse mode, which is one of the important operational characteristics of a semiconductor laser is achieved with a stable unimodal pattern.

A semiconductor laser is thus fabricated as above in prior art, where the n type $Al_{0.7}Ga_{0.3}As$ current blocking layer 8 which contains a high percentage of Al is grown on the p type $Al_{0.7}Ga_{0.3}As$ etching stopper layer which also contains a high percentage of Al. Therefore, it is highly probable that Al is easily oxidized during fabrication and this results in poor crystallinity and surface morphology, or in poor reliability as the current blocking effect is gradually lost because of the multitude of defects present in the crystal.

In order to resolve the situation mentioned above, it may be possible to use a p type GaAs layer as the etching stopper layer 15 instead of the p type $Al_{0.7}Ga_{0.3}As$ layer. According to this method, since p type GaAs is far less susceptible to oxidation than $Al_{0.7}Ga_{0.3}As$, those problems described above are solved. However, the band gap energy of a GaAs etching stopper layer is smaller than the band gap energy of the active layer 3 and, therefore, the laser light originating in the active layer 3 is re-absorbed by the p type GaAs etching stopper layer. This poses other problems of the degradation of laser characteristics such as an asymmetrical far-field pattern or an increase in the threshold current or the operating current.

SUMMARY OF THE INVENTION

It is an object of the present invention to provide a method of fabricating a semiconductor laser which is equipped with a current blocking layer of high quality and has excellent laser characteristics.

Other objects and advantages of the invention will become apparent from the detailed description that follows. The detailed description and specific embodiments described are provided only for illustration since various additions and modifications within the scope of the invention will be apparent to those of skill in the art from the detailed description.

According to a first aspect of the present invention, a method of fabricating a semiconductor laser comprises forming by successive crystal growth on a first conductivity type semiconductor substrate a first conductivity type cladding layer, an active layer, a first second conductivity type cladding layer comprising a semiconductor material containing Al as a constituent, an etching stopper layer doped with a high concentration of an impurity and comprising a semiconductor material not containing Al as a constituent, and a second second conductivity type cladding layer comprising a semiconductor material containing Al as its constituent, thereby fabricating a semiconductor laminated structure; forming a stripe-shaped insulating film pattern on the second second conductivity type cladding layer; etching the second second conductivity type cladding layer utilizing the stripe-shaped insulating film pattern as a mask until the etching front reaches the etching stopper layer, thereby forming a ridge having a stripe configuration; forming a current blocking layer by crystal growth such that the ridge is buried by the current blocking layer; after removing the insulating film pattern, forming a second conductivity type contact layer on the ridge and on the current blocking layer; and disordering the etching stopper layer by heat treatment of the semiconductor laminated structure after forming the current blocking layer. Therefore, a current blocking layer of improved crystallinity and of high reliability is obtained. Furthermore, laser characteristics are improved since the unwanted absorption of the laser light which originates at the active layer by the etching stopper layer is eliminated.

According to a second aspect of the present invention, in the fabricating method described as the first aspect of the present invention, the heat treatment is performed with heat applied to the semiconductor laminated structure when the current blocking layer is being grown. Therefore, since the disordering of the etching stopper layer can be performed during the growth process of the current blocking layer, the fabricating process can be simplified.

According to a third aspect of the present invention, in the fabricating method described as the first aspect of the present invention, the first and second second conductivity type cladding layers comprise AlGaAs and the etching stopper layer comprises GaAs. Therefore, a semiconductor laser which has a high quality current blocking layer and possesses excellent laser characteristics is fabricated.

According to a fourth aspect of the present invention, in the fabricating method described as the first aspect of the present invention, the etching stopper layer has a thickness of 20 nm or less. Therefore, a semiconductor laser which has a high quality current blocking layer and possesses excellent laser characteristics is fabricated.

According to a fifth aspect of the present invention, in the fabricating method described as the first aspect of the present invention, the etching stopper layer is doped with an impurity to a concentration of $5 \times 10^{18}$ cm$^{-3}$ or greater. Therefore, a semiconductor laser which has a high quality current blocking layer and possesses excellent laser characteristics is fabricated.

According to a sixth aspect of the present invention, in the fabricating method described as the first aspect of the present invention, the heat treatment is performed at 600° C. or above. Therefore, a semiconductor laser which has a high quality current blocking layer and possesses the excellent laser characteristics is fabricated.

According to a seventh aspect of the present invention, a method of fabricating a semiconductor laser comprises forming by successive crystal growth on a first conductivity type semiconductor substrate a first conductivity type cladding layer, an active layer, a first second conductivity type cladding layer comprising a semiconductor material containing Al as a constituent, an etching stopper layer comprising a semiconductor material not containing Al as a constituent, and a second second conductivity type cladding layer comprising a semiconductor material containing Al as a constituent, thereby fabricating a semiconductor laminated structure; forming a stripe-shaped insulating film pattern on the second second conductivity type cladding layer; etching the second second conductivity type cladding layer utilizing the stripe-shaped insulating film pattern as a mask until the etching front reaches the etching stopper layer, thereby forming a ridge having a stripe configuration; forming a current blocking layer by crystal growth such that the ridge is buried by the current blocking layer; introducing a high concentration of a dopant impurity to the etching stopper layer by ion-implantation; after removing the insulating film pattern, forming a second conductivity type contact layer on the ridge and on the current blocking layer; and disordering the etching stopper layer by heat treatment of the semiconductor laminated structure after the ion-implantation. Therefore, a current blocking layer of improved crystallinity and of high reliability is obtained. Furthermore, laser characteristics are improved since the unwanted absorption of the laser light which originates at the active layer by the etching stopper layer is eliminated.

According to an eighth aspect of the present invention, in the fabricating method described as the seventh aspect of the present invention, the heat treatment is performed with heat applied to the semiconductor laminated structure when the second conductivity type contact layer is being grown. Therefore, since the disordering of the etching stopper layer can be performed during the growth process of the second conductivity type contact layer, the fabricating process can be simplified.

According to a ninth aspect of the present invention, in the fabricating method described as the seventh aspect of the present invention, the first and second second conductivity type cladding layers comprise AlGaAs and the etching stopper layer comprises GaAs. Therefore, a semiconductor laser which has a high quality current blocking layer and possesses excellent laser characteristics is fabricated.

According to a tenth aspect of the present invention, in the fabricating method described as the seventh aspect of the present invention, the etching stopper layer has a thickness of 20 nm or less. Therefore, a semiconductor laser which has a high quality current blocking layer and possesses excellent laser characteristics is fabricated.

According to an eleventh aspect of the present invention, in the fabricating method described as the seventh aspect of the present invention, the ion-implantation is performed to an impurity concentration of $5 \times 10^{18}$ cm$^{-3}$ or greater. Therefore, a semiconductor laser which has a high quality current blocking layer and possesses excellent laser characteristics is fabricated.

According to a twelfth aspect of the present invention, in the fabricating method described as the seventh aspect of the present invention, the heat treatment is performed at 600° C. or above. Therefore, a semiconductor laser which has a high quality current blocking layer and possesses excellent laser characteristics is fabricated.

According to a thirteenth aspect of the present invention, a fabricating method of a semiconductor laser comprises forming by successive crystal growth on a first conductivity type semiconductor substrate a first conductivity type cladding layer, an active layer, a first second conductivity type cladding layer comprising a semiconductor material containing Al as a constituent, an etching stopper layer comprising a semiconductor material not containing Al as a constituent, and a second second conductivity type cladding layer comprising a semiconductor material containing Al as a constituent and including a high dopant impurity concentration layer at a prescribed location in the direction of the crystal growth of the second second conductivity type cladding layer, thereby fabricating a semiconductor laminated structure; forming a stripe-shaped insulating film pattern on the second second conductivity type cladding layer; etching the second second conductivity type cladding layer utilizing the stripe-shaped insulating film pattern as a mask until the etching front reaches the etching stopper layer, thereby forming a ridge having a stripe configuration; forming a current blocking layer by crystal growth such that the ridge is buried with the current blocking layer; after removing the insulating film pattern, forming a second conductivity type contact layer on the ridge and on the current blocking layer; and disordering the etching stopper layer by the heat treatment of the semiconductor laminated structure after forming the current blocking layer, the heat treatment forcing the dopant impurity in the high dopant impurity concentration layer to diffuse into the etching stopper layer. Therefore, a current blocking layer of improved crystallinity and of high reliability is obtained. Furthermore, laser characteristics are improved since the absorption of the laser light which originates at the active layer by the etching stopper layer is eliminated.

According to a fourteenth aspect of the present invention, in the fabricating method described as the thirteenth aspect of the present invention, the heat treatment is performed with heat applied to the semiconductor laminated structure when the current blocking layer is being grown, and the high dopant impurity concentration layer is formed at such a prescribed location in the direction of the crystal growth of the second second conductivity type cladding layer that the impurity which diffuses from the high dopant impurity concentration layer reaches the etching stopper layer but not the active layer during the growth of the current blocking layer. Therefore, the fabricating process is simplified without degrading the active layer by preventing the impurity from entering the active layer.

According to a fifteenth aspect of the present invention, in the fabricating method described as the thirteenth aspect of the present invention, the first and second second conductivity type cladding layers comprise AlGaAs and the etching stopper layer comprises GaAs. Therefore, a semiconductor laser which has a high quality current blocking layer and possesses excellent laser characteristics is fabricated.

According to a sixteenth aspect of the present invention, in the fabricating method described as the thirteenth aspect of the present invention, the etching stopper layer has a thickness of 20 nm or less. Therefore, a semiconductor laser which has a high quality current blocking layer and possesses excellent laser characteristics is fabricated.

According to a seventeenth aspect of the present invention, in the fabricating method described as the thirteenth aspect of the present invention, the high dopant impurity concentration layer has an impurity concentration of $5 \times 10^{18}$ cm$^{-3}$ or greater. Therefore, a semiconductor laser which has a high quality current blocking layer and possesses excellent laser characteristics is fabricated.

According to an eighteenth aspect of the present invention, in the fabricating method described as the thirteenth aspect of the present invention, the heat treatment is performed at 600° C. or above. Therefore, a semiconductor laser which has a high quality current blocking layer and possesses excellent laser characteristics is fabricated.

According to a nineteenth aspect of the present invention, a semiconductor laser comprises a first conductivity type semiconductor substrate having a front surface and a rear surface; a first conductivity type cladding layer disposed on the front surface of the first conductivity type semiconductor substrate; an active layer disposed on the first conductivity type cladding layer; a first second conductivity type cladding layer disposed on the active layer and comprising a semiconductor material containing Al as a constituent; a disordered semiconductor layer disposed on the first second conductivity type cladding layer and containing a high concentration of a dopant impurity and not containing Al as a constituent; a second second conductivity type cladding layer having a ridge stripe shape disposed on the disordered semiconductor layer, the dopant impurity in the disordered layer being introduced into the first and second second conductivity type cladding layers and Al from the first and second second conductivity type cladding layers being introduced into the disordered layer; a current blocking layer disposed on the disordered semiconductor layer, burying the second second conductivity type cladding layer having a ridge stripe shape; a second conductivity type contact layer disposed on the second second conductivity type cladding layer and the current blocking layer; a first electrode disposed on the rear surface of the first conductivity type semiconductor substrate; and a second electrode disposed on the second conductivity type contact layer. A current blocking layer of improved crystallinity and high reliability is obtained. Furthermore, laser characteristics are improved since unwanted absorption of the laser light which originates at the active layer by the disordered semiconductor layer is eliminated.

According to a twentieth aspect of the present invention, in the semiconductor laser described in the nineteenth aspect of the present invention the disordered semiconductor layer is obtained as a result of the heat treatment conducted with heat applied when the current blocking layer is being grown. Therefore, since the disordering is performed during the growth of the current blocking layer, the fabricating process can be simplified.

According to a twenty-first aspect of the present invention, in the semiconductor laser described in the nineteenth aspect of the present invention the first and second second conductivity type cladding layers comprise AlGaAs and the disordered layer comprises GaAs. Therefore, a semiconductor laser which has a high quality current blocking layer and excellent laser characteristics is obtained.

BRIEF DESCRIPTION OF THE DRAWINGS

FIGS. 1(a)–1(d) are cross-sectional views and FIG. 4(e) is a perspective view showing a method of fabricating a semiconductor laser in accordance with a first embodiment of the present invention.

FIGS. 4(a)–4(d) are cross-sectional views and FIG. 1(e) is a perspective view all showing a method of fabricating a semiconductor laser according to the prior art.

DETAILED DESCRIPTION OF THE PREFERRED EMBODIMENTS

[Embodiment 1]

Figure 1:
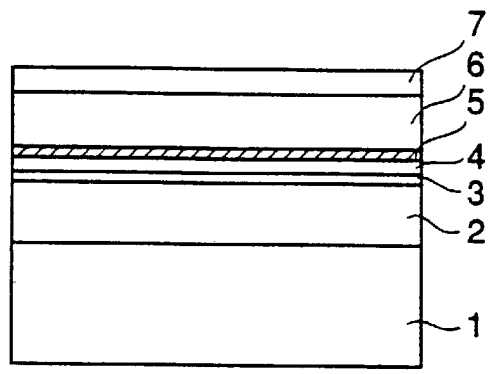
Figure 1:
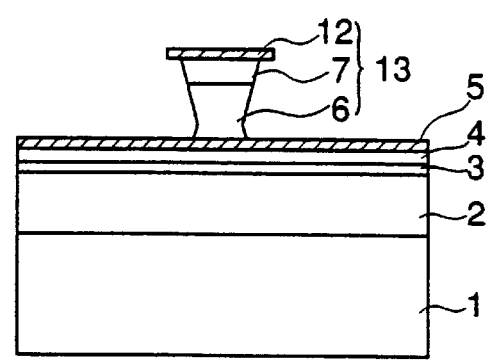
Figure 1:
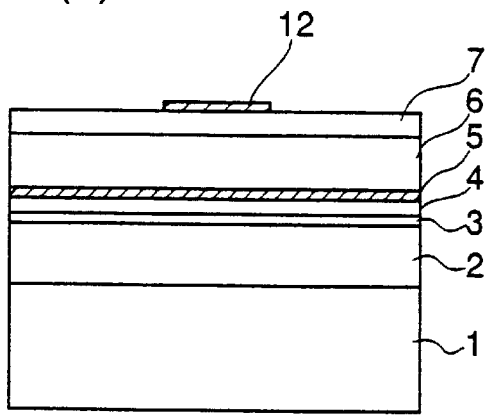
Figure 1:
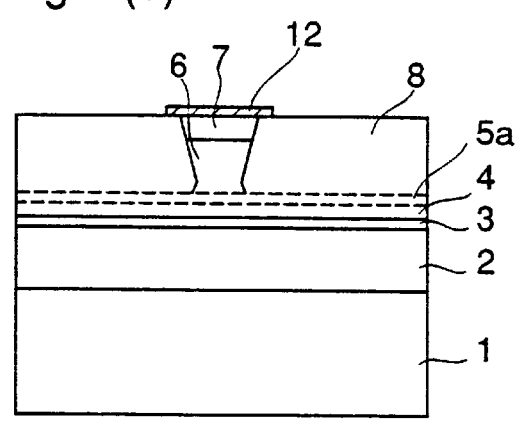
Figure 1:
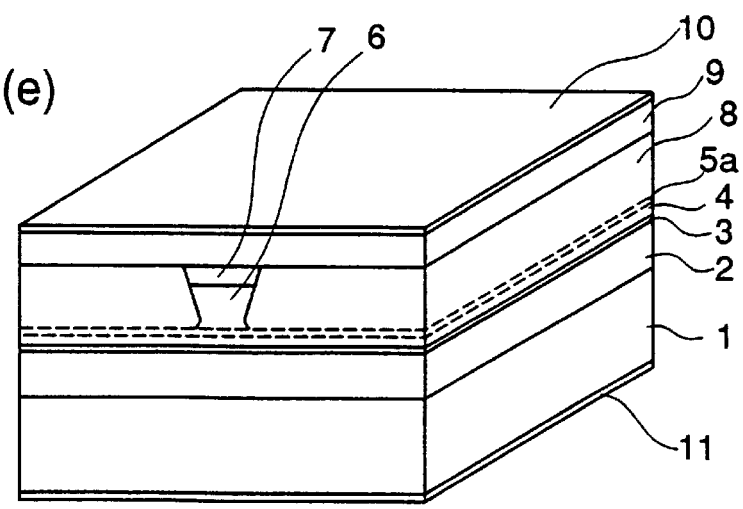

FIGS. 1(a)–1(d) are the cross-sectional views and FIG. 1(e) is a perspective view showing how a semiconductor laser is fabricated according to a first embodiment of this invention, where reference numeral 1 designates an n type GaAs semiconductor substrate having opposite front and rear surfaces, reference numeral 2 designates an n type $Al_{0.5}Ga_{0.5}As$ cladding layer of about 1.5 $\mu$m thickness and having a dopant impurity concentration of about $1\times10^{17}$ $cm^{-3}$, reference numeral 3 designates an active layer having a multi-quantum well structure comprising alternating $Al_{0.1}Ga_{0.9}As$ well layers and $Al_{0.3}Ga_{0.7}As$ barrier layers, reference numeral 4 designates a first p type $Al_{0.5}Ga_{0.5}As$ cladding layer of 0.2–0.4 $\mu$m thickness and dopant impurity concentration of about $1\times10^{18}$ $cm^{-3}$, reference numeral 5 designates a p type GaAs etching stopper layer having a high dopant impurity concentration of about $5\times10^{18}$ $cm^{-3}$ or greater, reference numeral 5a designates a disordered etching stopper layer, reference numeral 6 designates a second p type $Al_{0.5}Ga_{0.5}As$ cladding layer about 1.5 $\mu$m thickness and having a dopant impurity concentration of about $1\times10^{18}$ $cm^{-3}$, reference numeral 7 designates a first p type GaAs contact layer of 0.2–1 $\mu$m thickness and having a dopant impurity concentration about $2\times10^{19}$ $cm^{-3}$, reference numeral 8 designates an n type $Al_{0.7}Ga_{0.3}As$ current blocking layer having a dopant impurity concentration of about $5\times10^{18}$ $cm^{-3}$, where any material which is generally used to make a current blocking layer can also be used in this case, reference numeral 9 designates a second p type GaAs contact layer of 0.5–5 $\mu$m thickness and having a dopant impurity concentration of about $2\times10^{19}$ $cm^{-3}$, reference numeral 10 designates a p side electrode comprising Ti/Pt/Au, reference numeral 11 designates an n side electrode comprising AuGe/Ni/Ti/Au, reference numeral 12 designates an insulating film pattern (ridge mask), and reference numeral 13 designates a ridge.

A method of fabricating a semiconductor laser according to the first embodiment of this invention is explained as follows. First, the n type $Al_{0.5}Ga_{0.5}As$ cladding layer 2, the active layer 3, the first p type $Al_{0.5}Ga_{0.5}As$ cladding layer 4, the p type GaAs etching stopper layer 5 having a thickness of about 20 nm or less and which is doped with an impurity to about $5\times10^{18}$ $cm^{-3}$, the second p type $Al_{0.5}Ga_{0.5}As$ cladding layer 6, and the first p type GaAs contact layer 7 are epitaxially grown on the front surface of n type GaAs semiconductor substrate 1 employing MOCVD (Metal Organic Chemical Vapor Deposition) or MBE (Molecular Beam Epitaxy) method. A cross section of the wafer after the crystal growth is shown in FIG. 1(a). Then the insulating film pattern (ridge mask) 12 having a stripe configuration is formed on the wafer as shown in FIG. 1(b), using materials such as $Si_3N_4$ or $SiO_2$. This insulating film pattern 12 serves as an etching mask during ridge formation. That is, as shown in FIG. 1(c), etching is performed starting with the first contact layer 7 until the etching stopper layer 5 is reached so that the ridge configuration 13 is obtained using the insulating film pattern 12 as a mask. In this etching process, by using such a selective etchant that the first p type GaAs contact layer 7 and the second p type $Al_{0.5}Ga_{0.5}As$ cladding layer are etched but the p type GaAs etching stopper layer 5 is not, the ridge structure 13 is formed with good repeatability. An example of this etchant is a chlorine based etchant.

Next, as shown in FIG. 1(d), the n type $Al_{0.7}Ga_{0.3}As$ current blocking layer 8 is grown at both sides of the ridge 13 so as to bury the ridge 13. The insulating film 12 serves as a mask against the crystal growth, so that there is no crystal growth on the ridge. Here, if the growth temperature for this regrowth is chosen to be 600° C. or above, the p type GaAs etching stopper layer 5 which is doped with an impurity to $5\times10^{18}$ $cm^{-3}$ or greater produces a thermal diffusion during the regrowth. Zn or Mg which have a large diffusion coefficient and act as an acceptor in GaAs are often used as the impurity to dope the etching stopper layer 5. Be can be used to obtain the same effect. Since the thickness of the p type GaAs etching stopper layer 5 is about 20 nm or less which is as thin as a quantum well layer often used as an active layer in a semiconductor laser, in the first p type $Al_{0.5}Ga_{0.5}As$ cladding layer 4 and the second p type $Al_{0.5}Ga_{0.5}As$ cladding layer 6 which are in contact with the etching stopper layer, Al and Ga start to mutually diffuse as Zn, the dopant impurity, diffuses, disordering the etching stopper layer 5. As a result, the band gap energy of the disordered etching stopper layer 5a which results from the diffusion of impurities from the p type GaAs etching stopper layer 5 is greater than the band gap energy of p type GaAs, and the laser light originating in at the active layer 3 is no longer absorbed by the etching stopper layer 5a. The disordered etching stopper layer 5a finally has the same Al composition ratio as $Al_{0.5}Ga_{0.5}As$.

After the insulating film pattern 12 is removed by wet or dry etching, the second p type GaAs contact layer 9 is formed by crystal growth on the ridge and the current blocking layer 8. Finally, the n side electrode 11 and the p side electrode 10 are formed by deposition or the like on the rear surface of the n type GaAs semiconductor substrate 1 and on the second p type GaAs contact layer 9, respectively, to obtain the semiconductor laser shown in FIG. 1(e).

In this embodiment, as explained above, the current blocking layer 8 is grown on the p type GaAs etching stopper layer 5 which does not contain Al as a constituent. Therefore, the crystallinity of the current blocking layer 8 is much improved over the conventional p type $Al_{0.7}Ga_{0.3}As$ etching stopper layer. Consequently, the problem that the current blocking effect is gradually lost through operation due to a multitude of defects present in the current blocking layer produced in the conventional fabrication method is greatly resolved. Furthermore, since the etching stopper layer 5 contains a high concentration of a dopant impurity and heat during the formation of the current blocking layer 8 disorders the etching stopper layer 5, its band gap energy becomes greater than that of the active layer 3. Therefore, the laser light from the active layer 3 is not absorbed by the etching stopper layer 5a, causing no degradation of laser characteristics.

As shown in this embodiment, the etching stopper layer 5 which is thin and comprises a semiconductor material having a high concentration of a dopant impurity and not containing Al is used in the selective etching to form the ridge 13, and then the etching stopper layer 5 is disordered by heat during regrowth of the current blocking layer 8. Therefore, the semiconductor laser which has a superior current blocking effect and, thus, excellent laser characteristics are obtained.

In this embodiment, although the disordering of the etching stopper layer is done by performing the regrowth of the current blocking layer at a temperature of 600° C. or above, it is possible to treat the wafer at a temperature sufficiently high enough to disorder the etching stopper layer and to diffuse the dopant impurity after forming the current blocking layer. However, it is desirable to perform the disordering using heat during the contact layer regrowth or, as in the present embodiment, during the current blocking layer regrowth to simplify the process.

[Embodiment 2]

Figure 2:
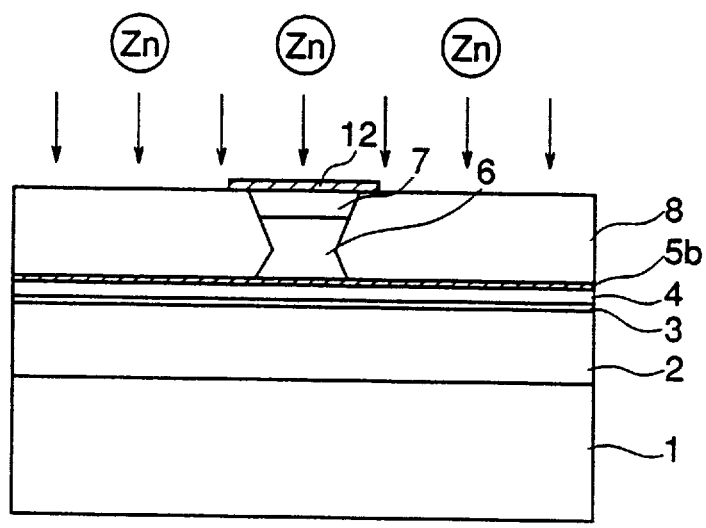
FIG. 2 is a cross-sectional view showing a main process step of a method of fabricating a semiconductor laser in accordance with a second embodiment of the present invention.

FIG. 2 is a cross-sectional view showing a main process step of a method of fabricating a semiconductor laser according to a second embodiment of the present invention, where the same reference numerals are used to designate the same or similar parts as used in FIGS. 1(a)–1(e).

In the first embodiment, the dopant impurity which causes the disordering has already been added to the p type GaAs etching stopper layer 5 prior to the disordering process. However, as shown in FIG. 2 according to the present embodiment, it is possible to grow a p type GaAs layer which does not contain a dopant impurity in a high concentration as the etching stopper layer 5b and implant a dopant impurity, such as, Zn in the etching stopper layer 5b by ion-implantation after forming the current blocking layer 8. The ion-implantation conditions are set so that the carrier concentration at a peak of the impurity profile is $5 \times 10^{18}$ cm$^{-3}$ or more and the peak is located exactly within the etching stopper layer 5b. After the ion-implantation, the etching stopper layer 5b can be disordered during the growth of the contact layer 9 which is performed at 600° C. or above. This makes the band gap energy of the etching stopper layer 5b greater than that of the active layer 3.

In this second embodiment, current blocking layer of excellent crystallinity is formed on the etching stopper layer which does not contain Al as a constituent, and the possibility that the laser light is absorbed by the etching stopper layer is eliminated. Therefore, the same effect as in the first embodiment is obtained.

In this second embodiment, although the disordering of the etching stopper layer is carried out by performing the regrowth of the contact layer at a temperature of 600° C. or above, it is possible to treat the wafer at a temperature sufficiently high to disorder the etching stopper layer and diffuse the dopant impurity after the ion-implantation. However, it is desirable to perform disordering using heat during the contact layer regrowth to simplify the process.

[Embodiment 3]

In the first embodiment, the impurity which causes the disordering is added to the growing etching stopper layer 5. However, this leaves the possibility that the diffusion of the dopant impurity from the etching stopper layer 5 during the growth of the current blocking layer 8 progresses to the extent that it reaches the active layer 3, past the first p type Al$_{0.5}$Ga$_{0.5}$As cladding layer 4, the thickness of which is as small as 0.2–0.4 μm. Since it is often the case that the active layer 3 has a quantum well structure, once the dopant impurity diffusion reaches the active layer 3, the active layer is disordered along with the etching stopper layer 5, and the semiconductor laser does not function any more.

Figure 3:
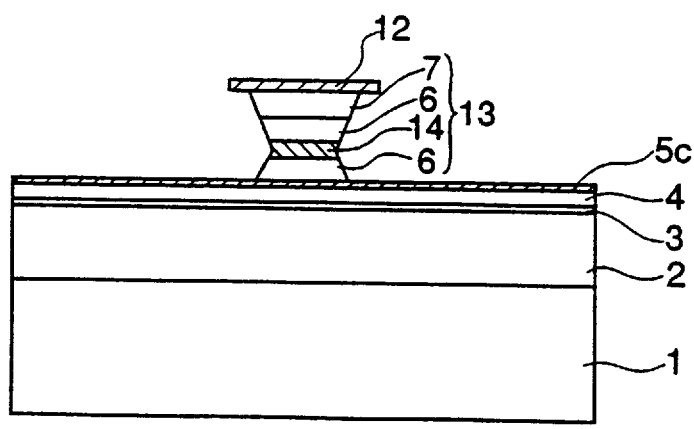
FIG. 3 is a cross-sectional view showing a main process step of a method of fabricating a semiconductor laser in accordance with a third embodiment of the present invention.

FIG. 3 is a cross-sectional view showing an step in a method of fabricating a semiconductor laser according to this third embodiment which is designed to solve the above mentioned problem. In the figure, an n type GaAs etching stopper layer 5c having a relatively low concentration of a dopant impurity is formed. The second p type Al$_{0.5}$Ga$_{0.5}$As cladding layer 6 includes a high dopant concentration layer 14 at a location spaced from the etching stopper layer 5c by 0.1–0.5 μm. Then, through selective etching, the ridge 13 is formed. The location of the high dopant concentration layer 14 is determined within the second cladding layer 6 such that the dopant impurity which diffuses from the high dopant concentration layer 14 during the growth of the current blocking layer 8 at 600° C. or above after the ridge formation reaches the etching stopper layer 5c but not the active layer 3. In this embodiment, the dopant impurity diffuses from the high dopant concentration layer 14 due to heat applied to the wafer when the current blocking layer 8 is grown. When this dopant impurity reaches the etching stopper layer 5c, the etching stopper layer 5c is disordered. This makes the band gap energy of the etching stopper layer 5c in close proximity of the light emitting region of the active layer 3 greater and prevents the light from being absorbed. Since the distance between the high dopant concentration layer 14 and the active layer 3 is greater than the distance between the high dopant concentration layer 14 and the etching stopper layer 5c, the dopant impurity reaches the etching stopper layer 5c but not the active layer 3 during diffusion when the current blocking layer 8 is grown. This prevents the active layer 3 from being disordered by the dopant impurity diffusion.

In this third embodiment, the problem mentioned above, that the active layer is disordered is solved and the same effect as obtained in the first embodiment can be obtained.

In addition, although the thickness is chosen to be 20 nm or less and the dopant impurity concentration to be $5 \times 10^{18}$ cm$^{-3}$ or greater for the etching stopper layer in the first and second embodiments, the present invention only requires that the thickness and the dopant impurity concentration of the etching stopper layer be such that the high temperature treatment yields disorder and the band gap energy of the disordered etching stopper layer be greater than that of the active layer. Even in this case, the same effect as obtained in the first and second embodiments can be obtained.

In addition, although a multi-quantum well structure made of alternating Al$_{0.1}$Ga$_{0.9}$As well layers and Al$_{0.3}$Ga$_{0.7}$As barrier layers is used as the active layer in each of the embodiments, the present invention can be applied to the cases where the active layer comprises other semiconductor materials such as GaAs or a single quantum well structure. In these cases, the same effect as obtained in each of the previous embodiments can be obtained.

In addition, although a semiconductor laser comprising AlGaAs series semiconductor materials is discussed in each of the embodiments, the present invention can be applied to semiconductor lasers made of other semiconductor materials containing Al as a constituent, and the same effect as obtained in each of the previously described embodiments can be obtained.

What is claimed is:

1. A method of fabricating a semiconductor laser comprising:

forming, by successive crystal growth on a first conductivity type semiconductor substrate, a first conductivity type cladding layer, an active layer, a first second conductivity type cladding layer comprising a semiconductor material containing Al as a constituent, an etch stopping layer containing a concentration of a dopant impurity and comprising a semiconductor material not containing Al as a constituent, and a second second conductivity type cladding layer comprising the semiconductor material containing Al as a constituent, thereby fabricating a semiconductor laminated structure;

forming a stripe-shaped insulating film pattern masking part of the second second conductivity type cladding layer;

etching the second second conductivity type cladding layer utilizing the stripe-shaped insulating film pattern as a mask until the etching front reaches the etch stopping layer, thereby forming a ridge having a stripe configuration;

forming a current blocking layer by crystal growth so that the ridge is buried by the current blocking layer;

removing the insulating film pattern;

forming a second conductivity type contact layer on the ridge and on the current blocking layer; and disordering the etch stopping layer by heat treatment of the semiconductor laminated structure.

2. The method of claim 1 including disordering during growth of the current blocking layer.

3. The method of claim 1 wherein the first and second conductivity type cladding layers comprise AlGaAs and the etch stopping layer comprises GaAs.

4. The method of claim 1 wherein the etch stopping layer has a thickness of no more than 20 nm.

5. The method of claim 1 wherein the etch stopping layer is doped with a dopant impurity to a concentration of at least $5 \times 10^{18} cm^{-3}$.

6. The method of claim 1 including heat treating at at least 600° C.

7. The method of claim 1 wherein the first conductivity type semiconductor substrate comprises n type GaAs, the first conductivity type cladding layer comprises n type AlGaAs, the active layer comprises AlGaAs, the first second conductivity type cladding layer comprises p type AlGaAs, the etch stopping layer comprises p type GaAs, the second second conductivity type cladding layer comprises p type AlGaAs, the current blocking layer comprises n type AlGaAs, and the second conductivity type contact layer comprises p type GaAs.

8. The method of claim 7 wherein the dopant impurity is selected from the group consisting of Zn, Mg, and Be.

9. A method of fabricating a semiconductor laser comprising:

forming, by successive crystal growth on a first conductivity type semiconductor substrate, a first conductivity type cladding layer, an active layer, a first second conductivity type cladding layer comprising a semiconductor material containing Al as a constituent, an etch stopping layer comprising a semiconductor material not containing Al as a constituent, and a second second conductivity type cladding layer comprising the semiconductor material containing Al as a constituent, thereby fabricating a semiconductor laminated structure;

forming a stripe-shaped insulating film pattern masking part of the second second conductivity type cladding layer;

etching the second second conductivity type cladding layer utilizing the stripe-shaped insulating film pattern as a mask until the etching front reaches the etch stopping layer, thereby forming a ridge having a stripe configuration;

forming a current blocking layer by crystal growth so that the ridge is buried by the current blocking layer;

introducing a dopant impurity into the etch stopping layer by ion-implantation;

removing the insulating film pattern;

forming a second conductivity type contact layer on the ridge and on the current blocking layer; and disordering the etch stopping layer by heat treatment of the semiconductor laminated structure after the ion-implantation.

10. The method of claim 9 including disordering during growth of the second conductivity type contact layer.

11. The method of claim 9 wherein the first and second conductivity type cladding layers comprise AlGaAs and the etch stopping layer comprises GaAs.

12. The method of claim 9 wherein the etch stopping layer has a thickness of no more than 20 nm.

13. The method of claim 9 including ion-implanting the dopant impurity to a concentration of at least $5 \times 10^{18} cm^{-3}$.

14. The method of claim 9 including heat treating at at least 600° C.

15. The method of claim 9 wherein the first conductivity type semiconductor substrate comprises n type GaAs, the first conductivity type cladding layer comprises n type AlGaAs, the active layer comprises AlGaAs, the first second conductivity type cladding layer comprises p type AlGaAs, the etch stopping layer comprises p type GaAs, the second second conductivity type cladding layer comprises p type AlGaAs, the current blocking layer comprises n type AlGaAs, and the second conductivity type contact layer comprises p type GaAs.

16. The method of claim 15 wherein the dopant impurity is selected from the group consisting of Zn, Mg, and Be.

17. A method of fabricating a semiconductor laser comprising:

forming, by successive crystal growth on a first conductivity type semiconductor substrate, a first conductivity type cladding layer, an active layer, a first second conductivity type cladding layer comprising a semiconductor material containing Al as a constituent, an etch stopping layer comprising a semiconductor material not containing Al as a constituent, and a second second conductivity type cladding layer comprising the semiconductor material containing Al as a constituent and including a dopant concentration region at a prescribed location in the direction of crystal growth of the second second conductivity type cladding layer, thereby fabricating a semiconductor laminated structure;

forming a stripe-shaped insulating film pattern masking part of the second second conductivity type cladding layer;

etching the second second conductivity type cladding layer utilizing the stripe-shaped insulating film pattern as a mask until the etching front reaches the etch stopping layer, thereby forming a ridge having a stripe configuration;

forming a current blocking layer by crystal growth so that the ridge is buried by the current blocking layer;

removing the insulating film pattern;

forming a second conductivity type contact layer on the ridge and on the current blocking layer; and disordering the etch stopping layer by heat treatment of the semiconductor laminated structure after forming the current blocking layer, the heat treatment forcing the dopant impurity in the dopant concentration region to diffuse into the etch stopping layer.

18. The method of claim 17 including:
    disordering during growth of the current blocking layer; and
    forming the dopant concentration region at a location in the direction of crystal growth of the second second conductivity type cladding layer so that the dopant impurity that diffuses from the dopant concentration region reaches the etch stopping layer but not the active layer during growth of the current blocking layer.

19. The method of claim 17 wherein the first and second conductivity type cladding layers comprise AlGaAs and the etch stopping layer comprises GaAs.

20. The method of claim 17 wherein the etch stopping layer has a thickness of no more than 20 nm.

21. The method of claim 17 wherein the dopant concentration region has a dopant impurity concentration of at least $5 \times 10^{18} cm^{-3}$.

22. The method of claim 17 including heat treating at at least 600° C.

23. The method of claim 17 wherein the first conductivity type semiconductor substrate comprises n type GaAs, the first conductivity type cladding layer comprises n type AlGaAs, the active layer comprises AlGaAs, the first second conductivity type cladding layer comprises p type AlGaAs, the etch stopping layer comprises p type GaAs, the second second conductivity type cladding layer comprises p type AlGaAs, the current blocking layer comprises n type AlGaAs, and the second conductivity type contact layer comprises p type GaAs.

24. The method of claim 23 wherein the dopant impurity of the dopant concentration region is selected from the group consisting of Zn, Mg, and Be.

25. The method of claim 1 including disordering the etch stopping layer after growing the current blocking layer.

* * * * *